United States Patent
Huang et al.

(10) Patent No.: US 8,852,974 B2
(45) Date of Patent: Oct. 7, 2014

(54) SEMICONDUCTOR LIGHT-EMITTING DEVICE AND METHOD FOR MANUFACTURING THE SAME

(71) Applicant: Epistar Corporation, Hsinchu (TW)

(72) Inventors: Chien-Fu Huang, Hsinchu (TW); Yi-Ming Chen, Hsinchu (TW); Yi-Tang Lai, Hsinchu (TW); Chia-Liang Hsu, Hsinchu (TW); Tsung-Hsien Yang, Hsinchu (TW); Tzu-Chieh Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/707,168

(22) Filed: Dec. 6, 2012

(65) Prior Publication Data

US 2014/0162386 A1    Jun. 12, 2014

(51) Int. Cl.
*H01L 21/00* (2006.01)
*H01L 33/22* (2010.01)

(52) U.S. Cl.
CPC .................................... *H01L 33/22* (2013.01)
USPC ................... 438/29; 438/42; 438/69; 438/71; 438/72

(58) Field of Classification Search
None
See application file for complete search history.

(56) References Cited

U.S. PATENT DOCUMENTS

| | | | |
|---|---|---|---|
| 6,791,117 B2 | 9/2004 | Yoshitake et al. | |
| 7,825,577 B2 * | 11/2010 | Hsu et al. | 313/498 |
| 7,833,425 B2 | 11/2010 | Wang et al. | |
| 7,834,369 B2 * | 11/2010 | Yao et al. | 257/95 |
| 8,143,639 B2 | 3/2012 | Jeong et al. | |
| 2008/0035953 A1 * | 2/2008 | Beom et al. | 257/103 |
| 2010/0224894 A1 | 9/2010 | Kim et al. | |
| 2011/0095324 A1 * | 4/2011 | Wang et al. | 257/98 |

* cited by examiner

*Primary Examiner* — Reema Patel
*Assistant Examiner* — Syed Gheyas
(74) *Attorney, Agent, or Firm* — Ditthavong & Steiner, P.C.

(57) ABSTRACT

A method for manufacturing semiconductor light-emitting devices comprising the steps of: providing a multi-layer semiconductor film comprising a surface; roughening the surface of the multi-layer semiconductor film to form a scattering surface; re-growing a semiconductor layer on the scattering surface; and roughening the semiconductor layer to form a sub-scattering portion on the scattering surface; wherein the sub-scattering portion is structurally smaller than the scattering surface.

6 Claims, 15 Drawing Sheets

US 8,852,974 B2

SEMICONDUCTOR LIGHT-EMITTING DEVICE AND METHOD FOR MANUFACTURING THE SAME

TECHNICAL FIELD

The present application relates to a semiconductor light-emitting device and a method for manufacturing the same, and more particularly to a semiconductor light-emitting device which is provided with a scattering surface and a sub-scattering portion formed on the scattering surface for a light extraction for increasing light extraction efficiency.

BACKGROUND

The light radiation theory of light-emitting device is to generate light from the energy released by the electrons moving between the n-type semiconductor layer and the p-type semiconductor layer. Because the light radiation theory of light-emitting device is different from the incandescent light which heats the filament, the light-emitting device is called a "cold" light source.

The light-emitting device mentioned above may be mounted with the substrate upside down onto a submount via a solder bump or a glue material to form a light-emitting apparatus. Besides, the submount further comprises one circuit layout electrically connected to the electrode of the light-emitting device via an electrical conductive structure such as a metal wire.

Moreover, the light-emitting device is more sustainable, long-lived, light and handy, and less power consumption, therefore it is considered as a new light source for the illumination market. The light-emitting device applies to various applications like the traffic signal, backlight module, street light and medical instruments, and is gradually replacing the traditional lighting sources.

SUMMARY

The present application provides a method for manufacturing semiconductor light-emitting devices comprising the steps of: providing a multi-layer semiconductor film comprising a surface; roughening the surface of the multi-layer semiconductor film to form a scattering surface; re-growing a semiconductor layer on the scattering surface; and roughening the semiconductor layer to form a sub-scattering portion on the scattering surface; wherein the sub-scattering portion is structurally smaller than the scattering surface.

The present application provides a method for manufacturing semiconductor light-emitting devices comprising the steps of: providing a multi-layer semiconductor film comprising a surface; roughening the surface of the multi-layer semiconductor film to form a scattering surface; roughening the scattering surface of the multi-layer semiconductor film to form a sub-scattering portion; and re-growing a semiconductor layer on the scattering surface; wherein the sub-scattering portion is structurally smaller than the scattering surface; wherein at least one air void is formed between the scattering surface and the semiconductor layer.

The present application provides a method for manufacturing semiconductor light-emitting devices comprising the steps of: providing a multi-layer semiconductor film comprising a surface; roughening the surface of the multi-layer semiconductor film to form a scattering surface; re-growing a first semiconductor layer on the scattering surface; roughening the first semiconductor layer to form a sub-scattering portion on the scattering surface; and re-growing a second semiconductor layer on the first semiconductor and the scattering surface; wherein the sub-scattering portion is structurally smaller than the scattering surface; wherein at least one air void is between the first semiconductor layer and the second semiconductor layer.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein:

FIG. 1 and FIG. 3A through FIG. 3D are schematic diagrams showing the process flow for manufacturing a semiconductor light-emitting device in accordance with a second embodiment of the present application;

DETAILED DESCRIPTION OF THE PREFERRED EMBODIMENTS

The present application discloses a semiconductor light-emitting device and a method for manufacturing the same. In order to make the illustration of the present application more explicit, the following description is stated with reference to FIG. 1 through FIG. 8.

Figure 1:
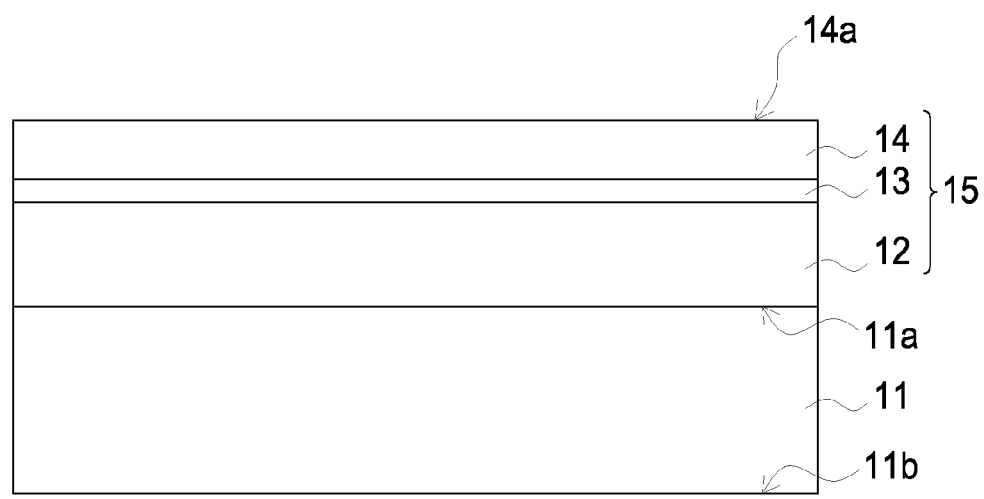
FIG. 1 through FIG. 2E' are schematic diagrams showing the process flow for manufacturing a semiconductor light-emitting device in accordance with a first embodiment of the present application.
Figure 2A:
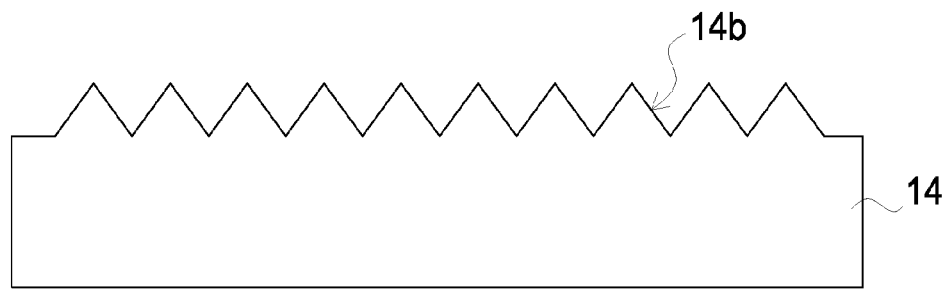
Figure 2B:
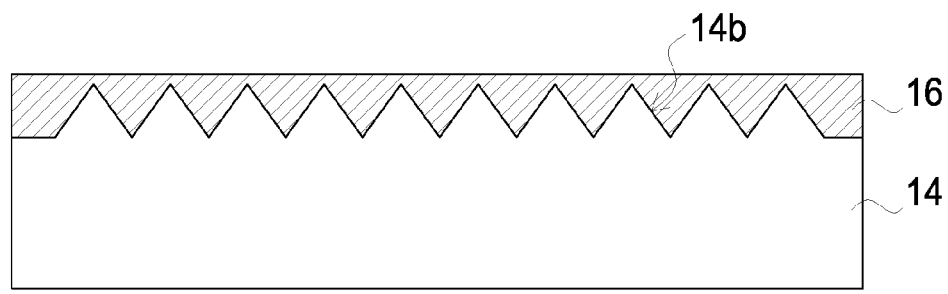
Figure 2C:
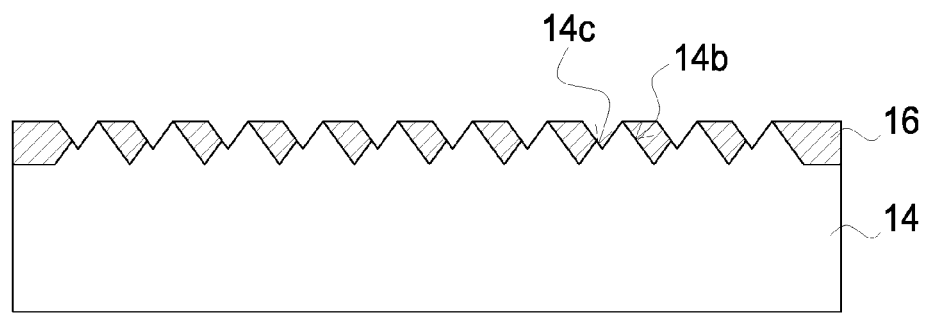
Figure 2C:
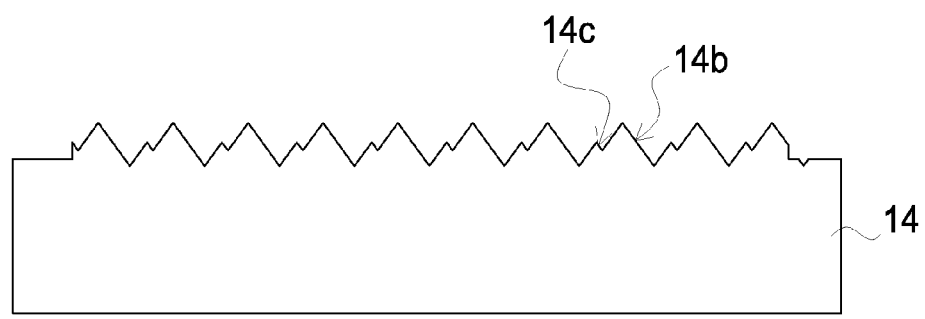
Figure 2D:
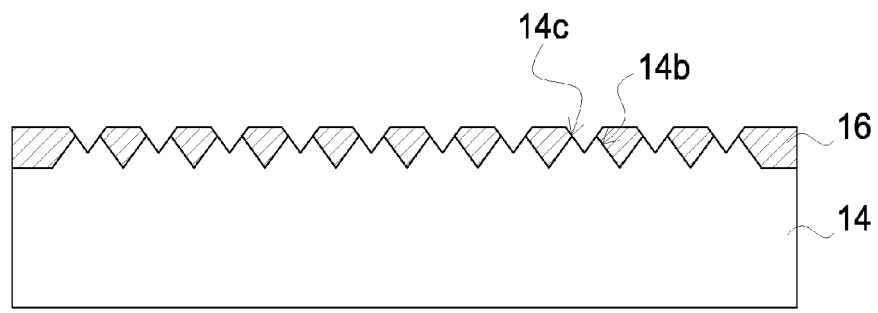
Figure 2D:
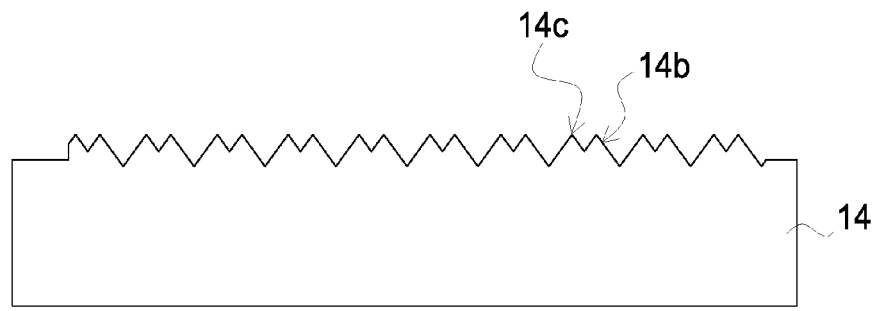
Figure 2E:
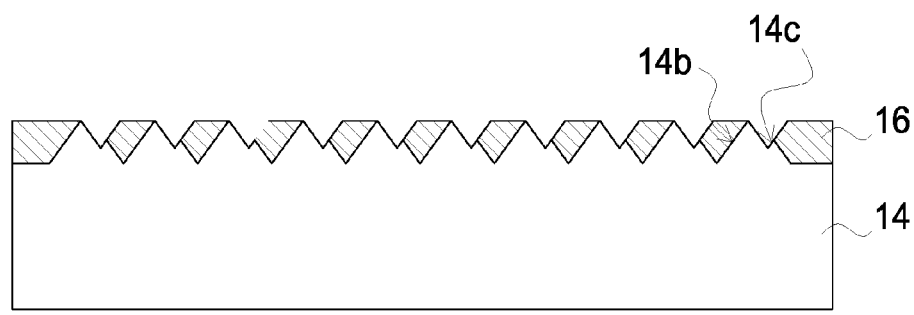
Figure 2E:
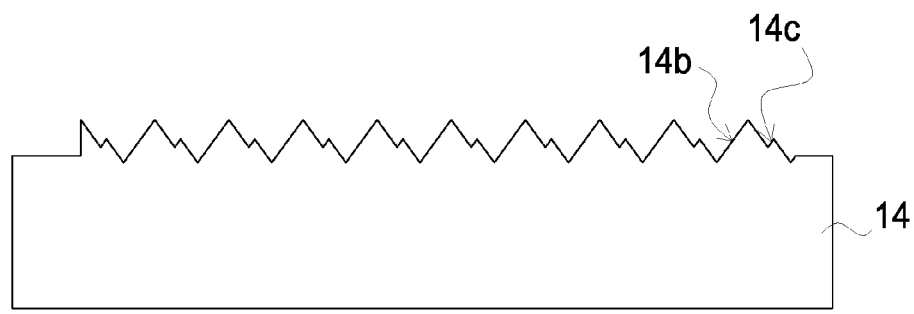

FIG. 1 through FIG. 2E' are schematic diagrams showing the process flow for manufacturing a semiconductor light-emitting device in accordance with a first embodiment of the present application. As FIG. 1 shows, a substrate 11 is provided for epitaxial growth, wherein the substrate 11 having a first surface 11a and a second surface 11b. In the embodiment, the material of the substrate 11 may be GaAs, silicon, silicon carbide, aluminum nitride, sapphire, indium phosphide, or gallium phosphide. A multi-layer semiconductor film 15 is grown on the first surface 11a of the substrate 11 by, for example, metal organic chemical vapor deposition (MOCVD), liquid phase deposition (LPD), or molecular beam epitaxy (MBE). The multi-layer semiconductor film 15 comprises a plurality of semiconductor layers, such as a first type semiconductor layer 12, a light emitting layer 13, and a second type semiconductor layer 14 stacked on the first surface 11a of the substrate 11. In the embodiment, the first type semiconductor layer 12 is n-type AlGaInP or AlInGaN series material, the active layer 13 is AlGaInP or AlInGaN series material, and the second type semiconductor layer 14 is p-type AlGaInP or AlInGaN series material. The light emitting layer 13 can emit a light. The multi-layer semiconductor film 15 has a surface 14a, wherein the surface 14a is opposite to the substrate 11. In the embodiment, the second type semiconductor layer 14 has the surface 14a.

As FIG. 2A shows, a scattering surface 14b is formed by roughening the surface 14a of the second type semiconductor layer 14. As FIG. 2B shows, re-growing a semiconductor layer 16 on the scattering surface 14b. The method of roughening the surface 14a of the second type semiconductor layer 14 comprises wet etching or dry etching. In the embodiment, the wet etching solution comprises hydrofluoric acid or nitride acid; the dry etching comprises reactive ion etching. The method of re-growing the semiconductor layer 16 on the scattering surface 14b comprises metal organic chemical vapor deposition (MOCVD), liquid phase deposition (LPD), or molecular beam epitaxy (MBE).

Then a sub-scattering portion 14c on the scattering surface 14b is formed by roughening the semiconductor layer 16. The method of roughening the semiconductor layer 16 comprises wet etching or dry etching. In the embodiment, the wet etching solution comprises hydrofluoric acid or nitride acid; the dry etching comprises reactive ion etching. The etching rate of different crystal planes of the semiconductor layer 16 is different as illustrated in FIG. 2C, FIG. 2D, and FIG. 2E so the morphology of the sub-scattering portion 14c is different as shown in FIG. 2C', FIG. 2D', and FIG. 2E'. The sub-scattering portion 14c is on the scattering surface 14b, and the sub-scattering portion 14c is structurally smaller than the scattering surface 14b. For example, the roughness scale of the sub-scattering portion 14c can be nano scale. If the substrate 11 is conductive, then a first electrode is formed on the second surface 11b of the substrate 11, and a second electrode is formed on the scattering surface 14b (not shown). If the substrate 11 is non-conductive, the multi-layer semiconductor film 15 is etched then a partial surface of the first type semiconductor layer 12 is exposed. A first electrode is formed on the exposed surface of the first type semiconductor layer 12, and a second electrode is formed on the scattering surface 14b (not shown). The material of the electrodes comprises metal material such as Cr, Ti, Ni, Pt, Cu, Au, Al, W, Sn, or Ag. Then a semiconductor light-emitting device 10 is formed. Because the semiconductor light-emitting device 10 is provided with the sub-scattering portion 14c which is formed on the scattering surface 14b, is structurally smaller than the scattering surface 14b, the confinement of the light beam pattern is improved and the light extraction efficiency is increased. The sub-scattering portion 14c may be provided as an irregular portion on the scattering surface 14b.

Figure 3A:
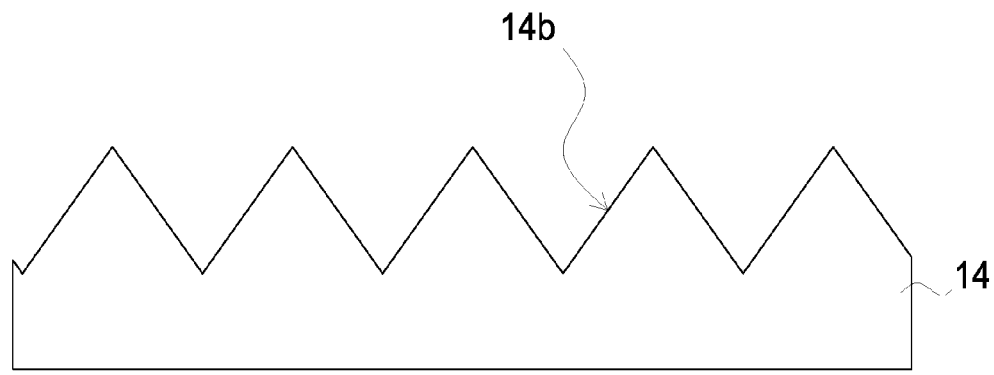
Figure 3B:
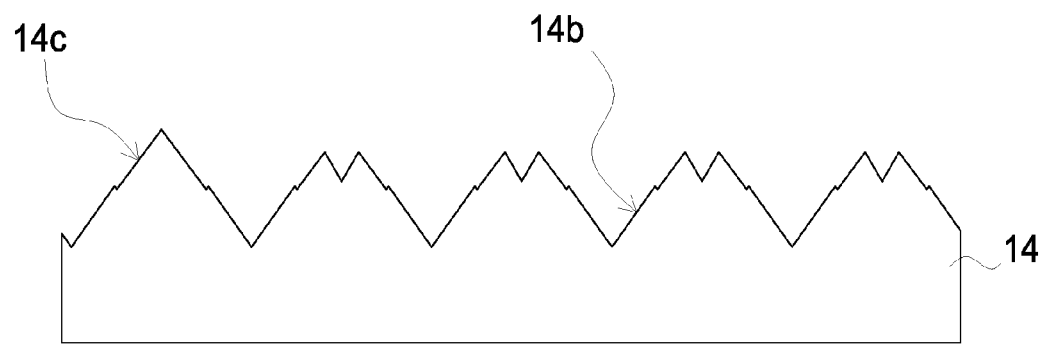

FIG. 1 and FIG. 3A through FIG. 3D are schematic diagrams showing the process flow for manufacturing a semiconductor light-emitting device in accordance with a second embodiment of the present application. The structure and manufacture process are the same as FIG. 1. In the embodiment, the second type semiconductor layer 14 has a surface 14a. As FIG. 3A shows, a scattering surface 14b is formed by roughening the surface 14a of the second type semiconductor layer 14. As FIG. 3B shows, a sub-scattering portion 14c is formed by roughening the scattering surface 14b of the second type semiconductor layer 14. The method for forming the scattering surface 14b and the sub-scattering portion 14c comprises wet etching or dry etching. In the embodiment, the wet etching solution comprises hydrofluoric acid or nitride acid; the dry etching comprises reactive ion etching. The sub-scattering portion 14c, which is formed on the scattering surface 14b, is structurally smaller than the scattering surface 14b. The sub-scattering portion 14c may be provided as an irregular portion formed on the scattering surface 14b. The roughness scale of the sub-scattering portion 14c can be nano scale.

Figure 3C:
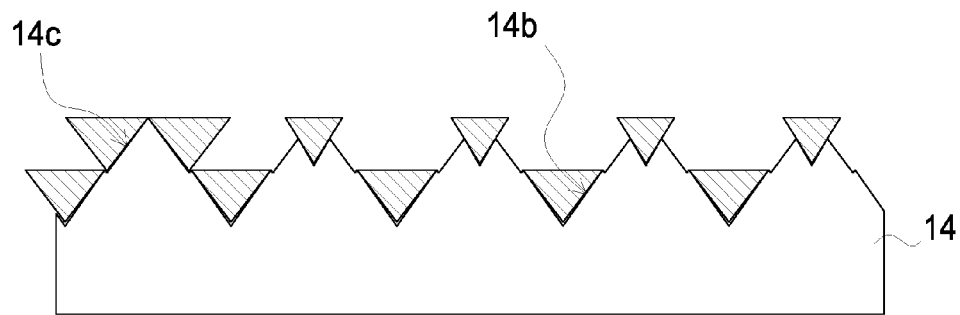
Figure 3D:
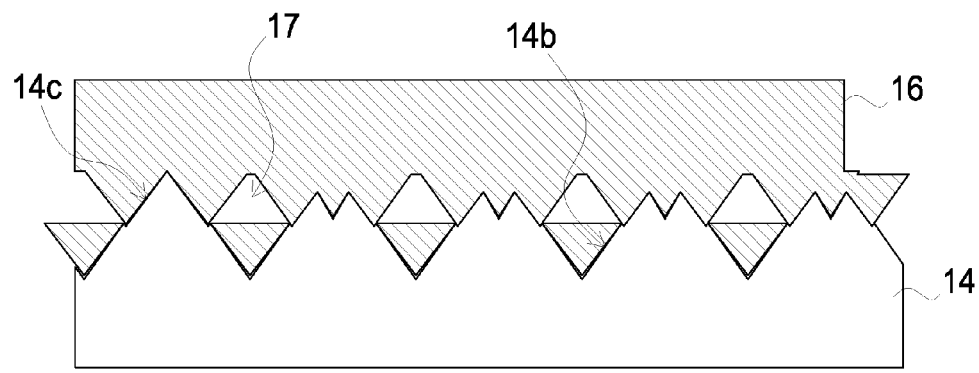

As FIG. 3C shows, a semiconductor layer 16 on the sub-scattering portion 14c is formed by re-growing. The method of re-growing the semiconductor layer 16 comprises metal organic chemical vapor deposition (MOCVD), liquid phase deposition (LPD), or molecular beam epitaxy (MBE). Because the scattering surface 14b and the sub-scattering portion 14c have different scale of roughness, at least one air void 17 is formed during the re-growing the semiconductor layer 16, as shown in FIG. 3D.

If the substrate 11 is conductive, then a first electrode is formed on the second surface 11b of the substrate 11, and a second electrode is formed on the semiconductor layer 16 (not shown). If the substrate 11 is non-conductive, the semiconductor layer 16 and the multi-layer semiconductor film 15 are etched then a partial surface of the first type semiconductor layer 12 is exposed. A first electrode is formed on the exposed surface of the first type semiconductor layer 12, and a second electrode is formed on the semiconductor layer 16 (not shown). The material of the electrodes comprises metal material such as Cr, Ti, Ni, Pt, Cu, Au, Al, W, Sn, or Ag. Then a semiconductor light-emitting device 10 is formed. Because the semiconductor light-emitting device 10 is provided with the sub-scattering portion 14c on the scattering surface 14b and at least one air void 17, the confinement of the light beam pattern is improved and the light extraction efficiency is increased.

Figure 4A:
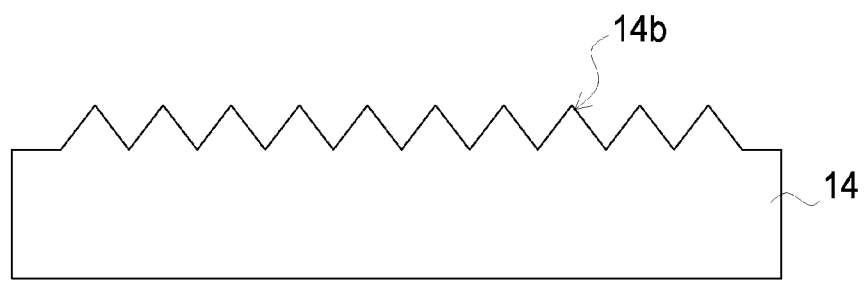
FIG. 4A through FIG. 4D are schematic diagrams showing the process flow for manufacturing a semiconductor light-emitting device in accordance with a third embodiment of the present application.
Figure 4B:
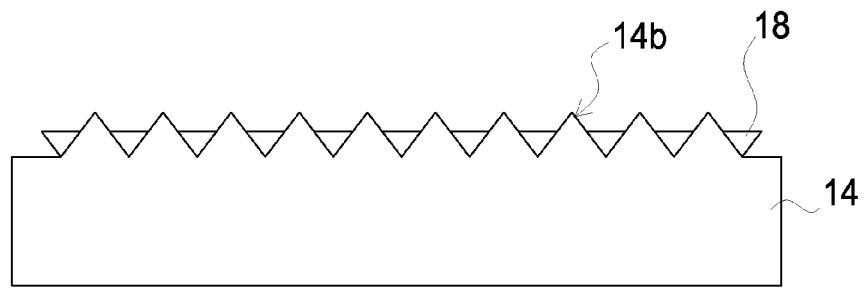

FIG. 4A through FIG. 4D are schematic diagrams showing the process flow for manufacturing a semiconductor light-emitting device in accordance with a third embodiment of the present application. As FIG. 4A shows, a scattering surface 14b is formed by roughening the surface 14a of the second type semiconductor layer 14. As FIG. 4B shows, re-growing a first semiconductor layer 18 on the scattering surface 14b. By controlling the re-growing rate, the first semiconductor layer 18 does not fill the concaves of the scattering surface 14b. The method of roughening the surface 14a of the second type semiconductor layer 14 comprises wet etching or dry etching. In the embodiment, the wet etching solution comprises hydrofluoric acid or nitride acid; the dry etching comprises reactive ion etching. The method of re-growing the first semiconductor layer 18 on the scattering surface 14b comprises metal organic chemical vapor deposition (MOCVD), liquid phase deposition (LPD), or molecular beam epitaxy (MBE).

Figure 4C:
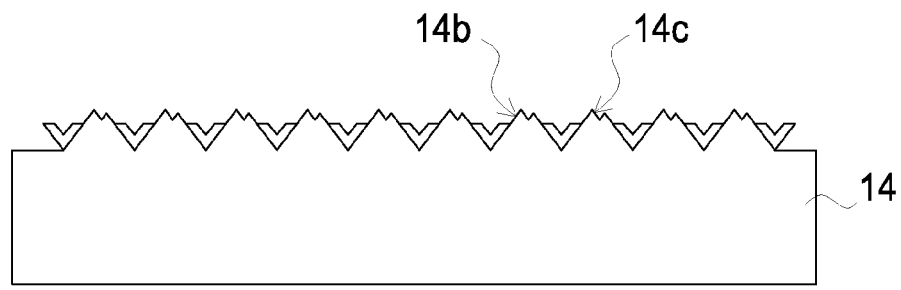

As FIG. 4C shows, a sub-scattering portion 14c is formed by roughening the first semiconductor layer 18 and scattering surface 14b. The method of roughening the first semiconductor layer 18 comprises wet etching or dry etching. In the embodiment, the wet etching solution comprises hydrofluoric acid or nitride acid; the dry etching comprises reactive ion etching. The roughness scale of the sub-scattering portion 14c can be nano scale.

Figure 4D:
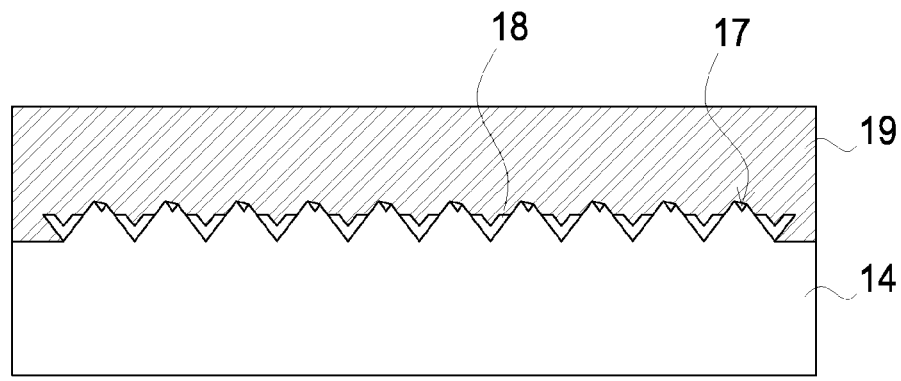

As FIG. 4D shows, a second semiconductor layer 19 on the sub-scattering portion 14c and the first semiconductor layer 18 are formed by re-growing. The method of re-growing the second semiconductor layer 19 comprises metal organic chemical vapor deposition (MOCVD), liquid phase deposition (LPD), or molecular beam epitaxy (MBE). Because the scattering surface 14b and the sub-scattering portion 14c have different roughness, at least one air void 17 is formed during re-growing the second semiconductor layer 19.

If the substrate 11 is conductive, then a first electrode is formed on the second surface 11b of the substrate 11, and a second electrode is formed on the second semiconductor layer 19 (not shown). If the substrate 11 is non-conductive, the second semiconductor layer 19, the first semiconductor layer 18 and the multi-layer semiconductor film 15 is etched then a partial surface of the first type semiconductor layer 12 is exposed. A first electrode is formed on the exposed surface of the first type semiconductor layer 12, and a second electrode is formed on the second semiconductor layer 19 (not shown). The material of the electrodes comprises metal material such as Cr, Ti, Ni, Pt, Cu, Au, Al, W, Sn, or Ag. Then a semiconductor light-emitting device 10 is formed. Because the semiconductor light-emitting device 10 is provided with the sub-scattering portion 14c on the scattering surface 14b and at least one air void 17, the confinement of the light beam pattern is improved and the light extraction efficiency is increased.

Figure 5:
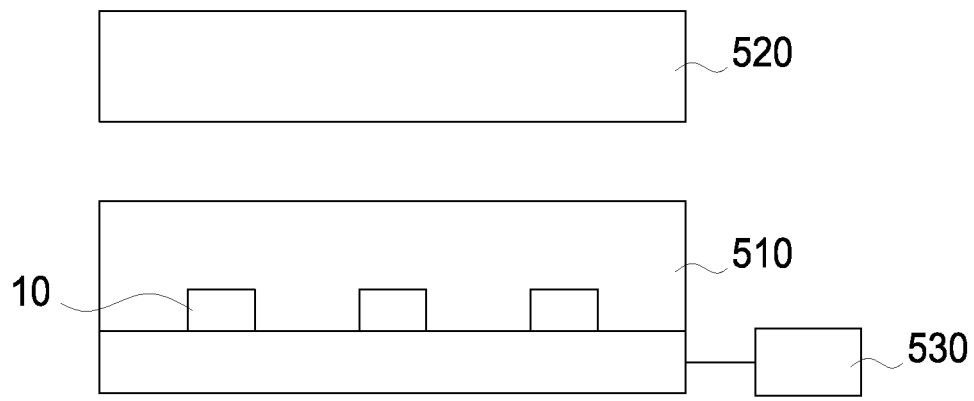
FIG. 5 is a schematic diagram of a backlight module device in accordance with a fourth embodiment of the present application.

FIG. 5 shows a schematic diagram of a backlight module device 500 in accordance with a fourth embodiment of the present application. The backlight module device 500 comprises a light source device 510 having the semiconductor light-emitting device 10 of the above mentioned embodiments, an optics device 520 deposited on the light extraction pathway of the light source device 510, and a power supplement 530 which provides a predetermined power to the light source device 510.

Figure 6:
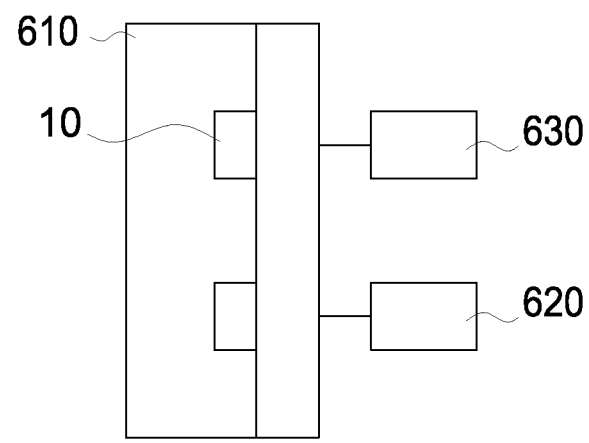
FIG. 6 is a schematic diagram of an illumination device in accordance with a fifth embodiment of the present application

FIG. 6 shows a schematic diagram of an illumination device 600 in accordance with a fifth embodiment of the present application. The illumination device 600 can be automobile lamps, street lights, flashlights, indicator lights and so forth. The illumination device 600 comprises a light source device 610 having the semiconductor light-emitting device 10 of the above mentioned embodiments, a power supply 620 which provides a predetermined power to the light source device 610, and a control element 630 which controls the current driven into the light source device 610.

Figure 7:
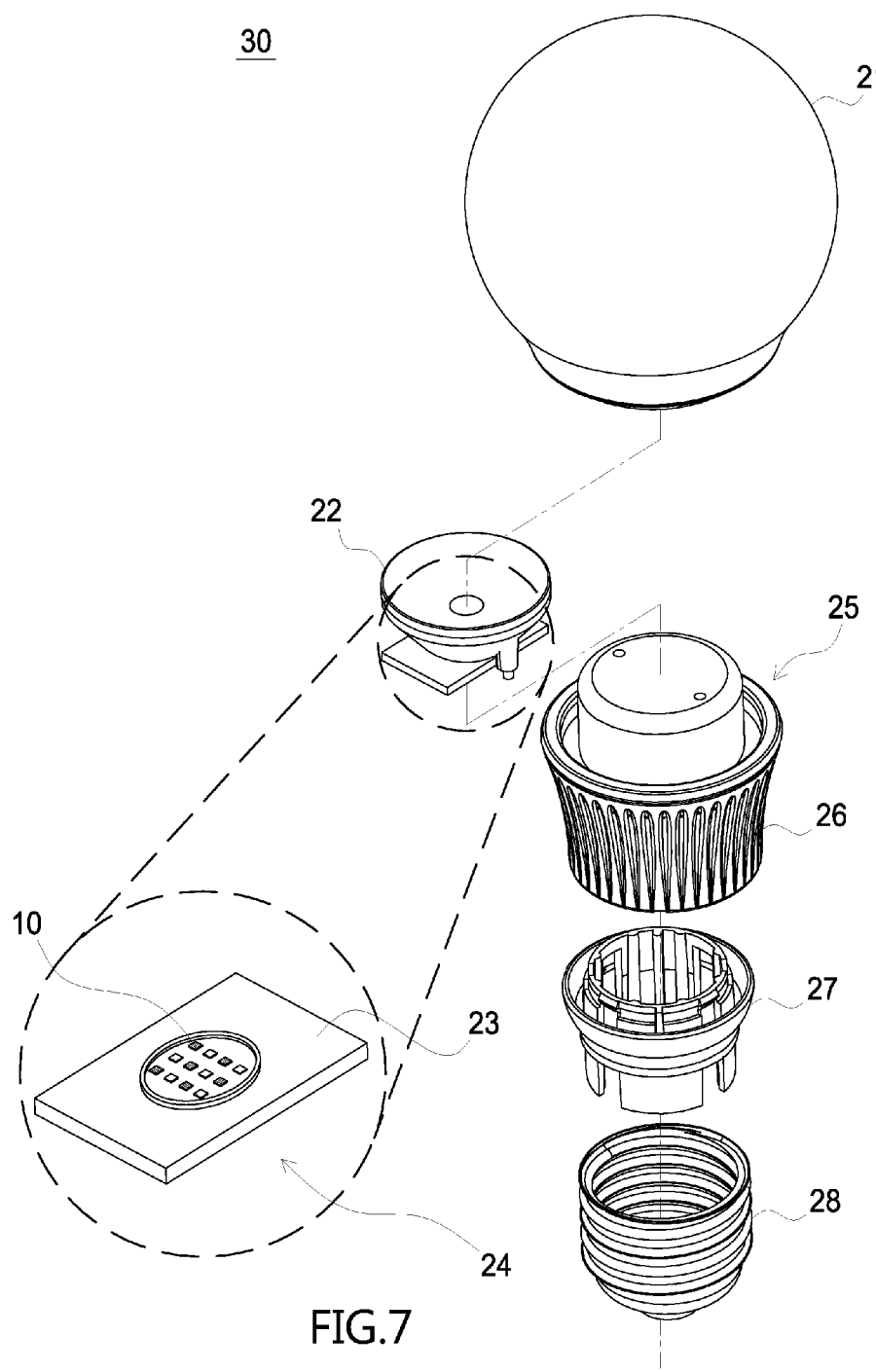
FIG. 7 is an explosive diagram of a bulb in accordance with a sixth embodiment of the present application.

FIG. 7 shows an explosive diagram of a bulb 30 in accordance with a sixth embodiment of the present application. The bulb 30 comprises a cover 21, a lens 22, a lighting module 24, a lamp holder 25, a heat sink 26, a connecting part 27, and an electrical connector 28. The lighting module 24 comprises a carrier 23 and a plurality of semiconductor light-emitting device 10 of any one of the above mentioned embodiments on the carrier 23.

In accordance with the embodiments in the application, the first semiconductor layer 12 and the second type semiconductor layer 14 of the multi-layer semiconductor film 15 are two single-layer structures or two multiple layers structure ("multiple layers" means two or more than two layers) having different electrical properties, polarities, dopants for providing electrons or holes respectively. If the first type semiconductor layer 12 and the second type semiconductor layer 14 are composed of the semiconductor materials, the conductivity type can be any two of p-type, n-type, and i-type. The light emitting layer 13 disposed between the first type semiconductor layer 12 and the second type semiconductor layer 14 is a region where the light energy and the electrical energy could transfer or could be induced to transfer.

In another embodiment of this application, the light emission spectrum of the multi-layer semiconductor film 15 after transferring can be adjusted by changing the physical or chemical arrangement of one layer or more layers in the light emitting layer 13. The structure of the light emitting layer can be a single heterostructure (SH), a double heterostructure (DH), a double-side double heterostructure (DDH), or a multi-quantum well (MQW) structure. Besides, the wavelength of the emitted light could also be adjusted by changing the number of the pairs of the quantum well in a MQW structure.

In one embodiment of this application, a buffer layer (not shown) could be optionally formed between the substrate 11 and the multi-layer semiconductor film 15. The buffer layer between two material systems can be used as a buffer system. For the structure of the semiconductor light-emitting device, the buffer layer is used to reduce the lattice mismatch between two material systems. On the other hand, the buffer layer could also be a single layer, multiple layers, or a structure to combine two materials or two separated structures where the material of the buffer layer can be organic, inorganic, metal, semiconductor, and so on, and the function of the buffer layer can be as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on. The material of the buffer layer can be AlN, GaN, InP, GaP or other suitable materials. The fabricating method of the buffer layer can be sputter or atomic layer deposition (ALD).

A contact layer (not shown) can also be optionally formed on the multi-layer semiconductor film 15. The contact layer is disposed on the second type semiconductor layer 14 opposite to the light emitting layer 13. Specifically speaking, the contact layer could be an optical layer, an electrical layer, or the combination of the two. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 µm-0.6 µm.

Figure 8A:
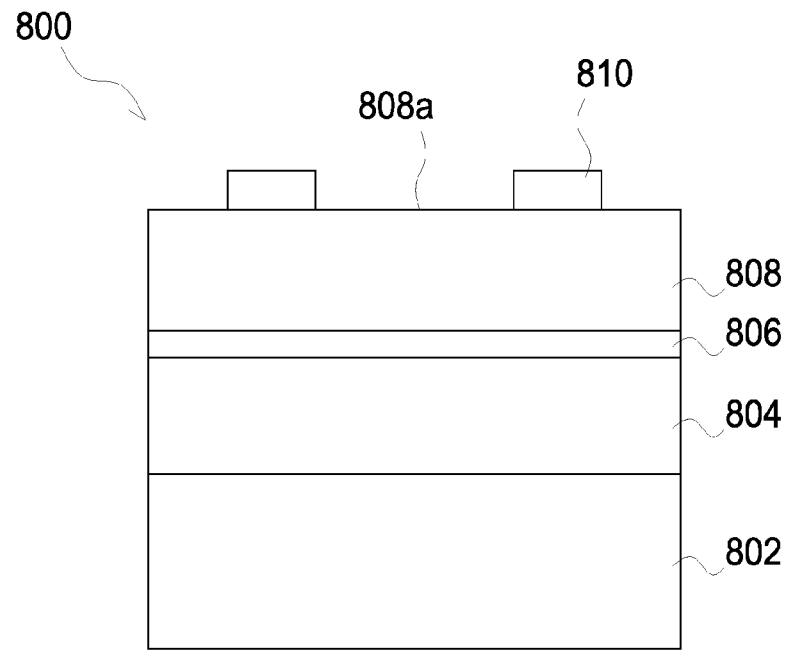
FIG. 8A through FIG. 8G are schematic diagrams showing the process flow for manufacturing a semiconductor light-emitting device in accordance with a seventh embodiment of the present application.

FIGS. 8A through 8G are schematic diagrams showing the process flow for manufacturing a semiconductor light-emitting device in accordance with a seventh embodiment of the present application. Referring to FIG. 8A, a semiconductor light-emitting device 800 including a substrate 802; a first type semiconductor layer 804 formed on the substrate; an active layer 806 formed on the first type semiconductor layer 804; a second type semiconductor layer 808 having a surface 808a formed on the active layer 806; and an electrode 810 formed on the surface 808a of the second type semiconductor layer 808 is disclosed.

Figure 8B:
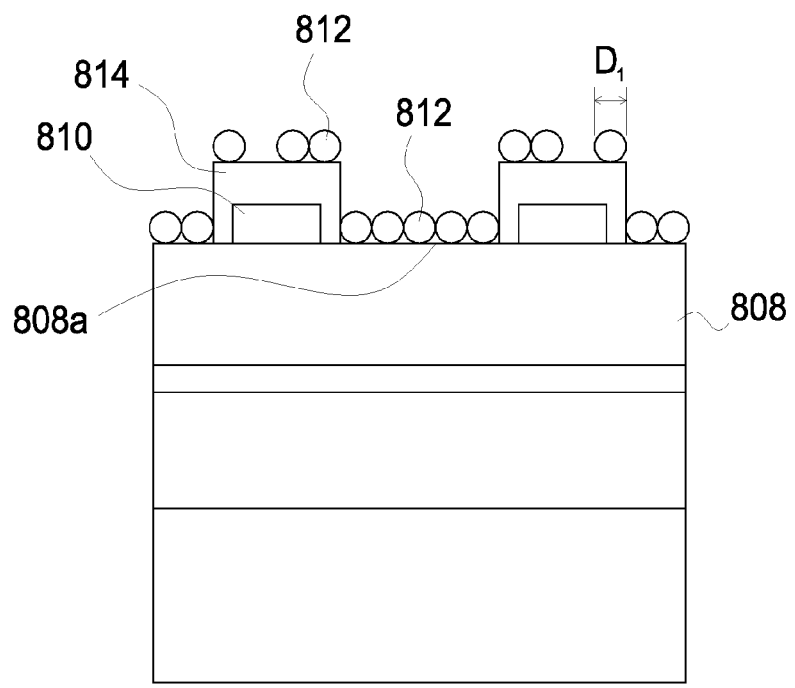

Referring to FIG. 8B, a mask 814 can be formed to cover the electrode 810. For example, the mask 814 can be an oxide layer formed by lithography and etching, therefore the electrode 810 is covered by the mask 814, and most region of the surface 808a can be exposed. A plurality of particles 812 are formed on the mask 814 and the surface 808a of the second type semiconductor layer 808. The particles 812 can be prepared in advance, and then arranged on the surface 808a after the electrode 810 is covered by the mask 814. The amount of the particles 812 on the surface 808a can be positively related with the area of the surface 808a. Preferably, each of the plurality of the particles 812 can be spherical with a first diameter $D_1$, and the particles are disposed as a hexagonal close-packed arrangement. The material of the particles 812 can include polymer, for example, Polystyrene (PS).

Figure 8C:
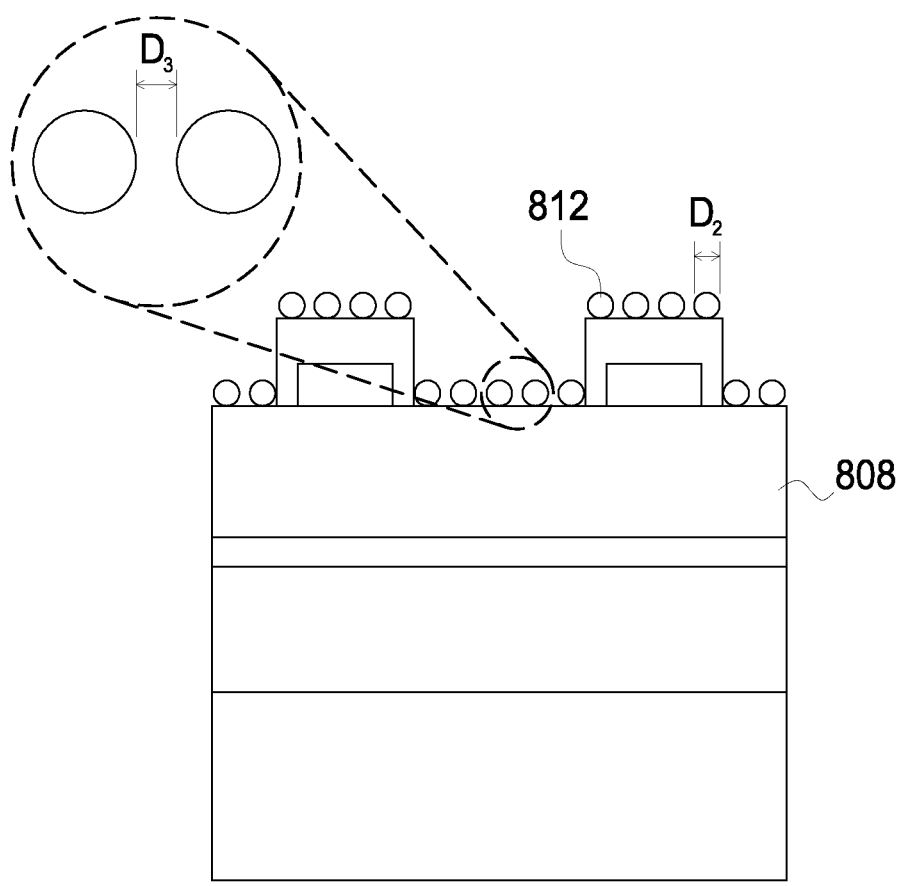

Referring to FIG. 8C, providing a first etching process including dry etching to reduce the size of each particle 812 to have a second diameter $D_2$, therefore the particles 812 are separated from each other. In accordance with the hexagonal close-packed arrangement of the particles 812 in FIG. 8B, the intervals $D_3$ shown in the figure can be approximately uniform. The first diameter $D_1$ in FIG. 8B can be reduced 15% to 20% to be the second diameter $D_2$.

Figure 8D:
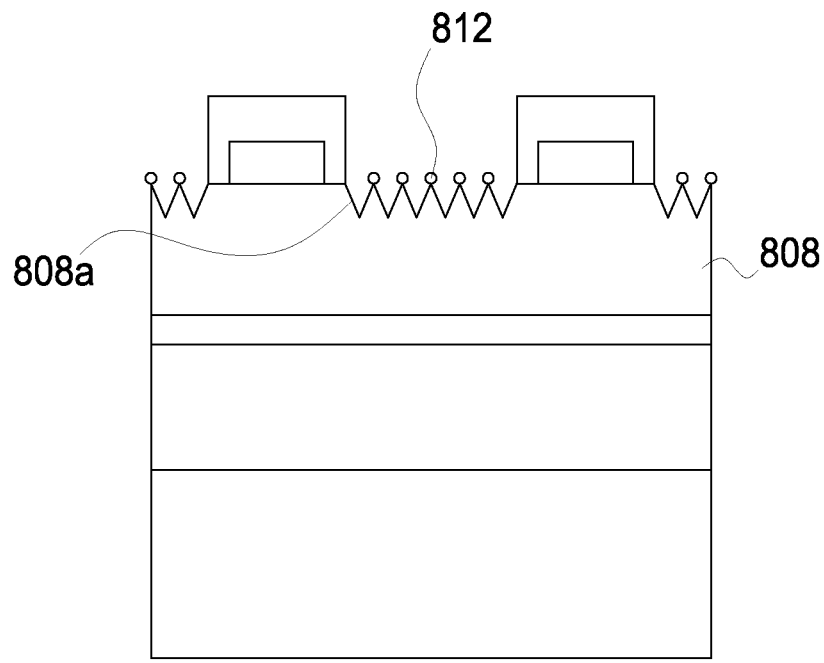
Figure 8E:
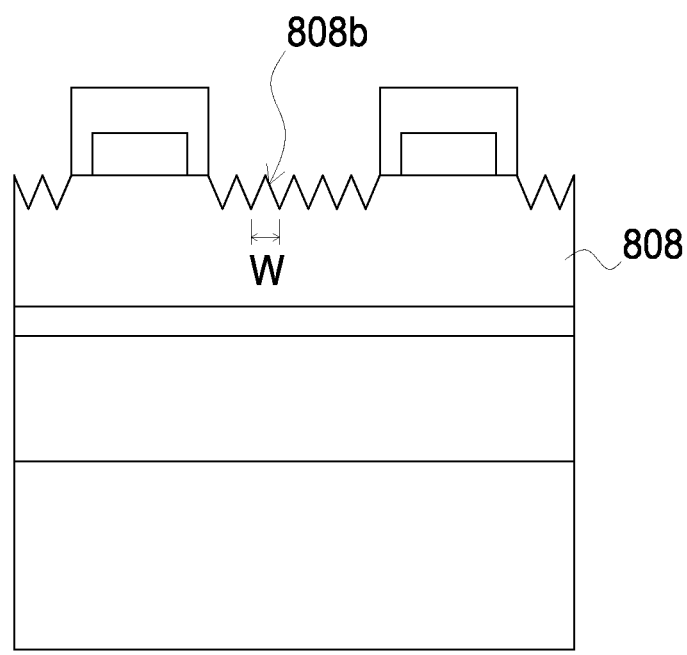

Referring to FIGS. 8D and 8E, providing a second etching process on the surface 808a and the particles 812. The method of roughening the surface 808a of the second type semiconductor layer 808 includes dry etching. In the embodiment, the dry etching includes reactive ion etching. As shown in FIG. 8D, the size one or more than one of the particles 812 is further reduced and the surface 808a is roughened at the same time, and the second etching process can be continued till the particles 812 being removed completely. As shown in FIG. 8E, after finishing the second etching process, a scattering surface 808b having approximately regular roughening pattern is formed. The scattering surface 808b can have multiple triangular protrusions in cross sectional view, and each protrusion can have width W in a range of 0.5~5 μm.

Figure 8F:
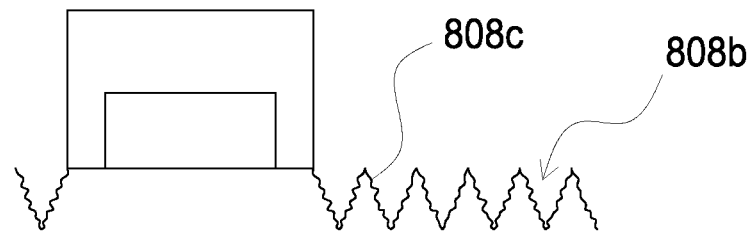

Referring to FIG. 8F, a sub-scattering portion 808c can be formed on the scattering surface 808b by providing a third etching process. In the embodiment, the third etching process can be wet etching, and the wet etching solution includes hydrofluoric acid or nitride acid. Similar to above embodiments, the morphology of the sub-scattering portion 808c can be structurally smaller than that of the scattering surface 808b.

Figure 8G:
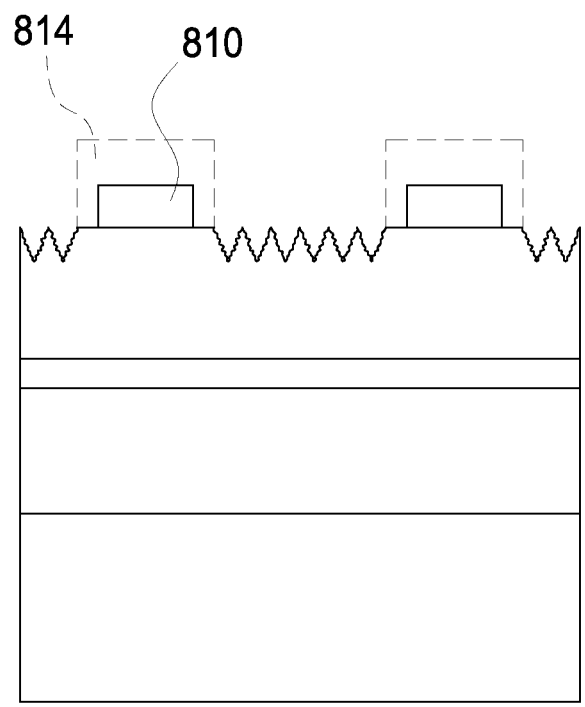

Referring to FIG. 8G, the mask 814 covering the electrode 810 is removed by lithography and etching, therefore the electrode 810 can be exposed for wire bonding or other electrical connection.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method for manufacturing semiconductor light-emitting devices, comprising the steps of:
   providing a multi-layer semiconductor film comprising a surface;
   roughening the surface of the multi-layer semiconductor film to form a scattering surface;
   re-growing a semiconductor layer on the scattering surface; and
   roughening the semiconductor layer to form a sub-scattering portion on the scattering surface by wet etching;
   wherein the sub-scattering portion is structurally smaller than the scattering surface, and the semiconductor layer comprises different crystal planes.

2. The method according to claim 1, further comprising the steps of:
   providing a substrate; and
   growing the multi-layer semiconductor film on the substrate, wherein the scattering surface is opposite to the substrate.

3. The method according to claim 1, wherein the step of growing the multi-layer semiconductor film comprises forming a light emitting layer for emitting light.

4. The method according to claim 1, wherein the wet etching solution comprises hydrofluoric acid or nitric acid.

5. The method according to claim 1, wherein the roughness scale of the sub-scattering portion is nano scale.

6. The method according to claim 1, further comprising re-growing a second semiconductor layer on the first semiconductor layer and the scattering surface after the step of roughening the semiconductor layer.

* * * * *